US007778296B1

(12) United States Patent
Vuckovic et al.

(10) Patent No.: US 7,778,296 B1
(45) Date of Patent: Aug. 17, 2010

(54) OPTICAL MICROCAVITY EMITTER ARRANGEMENTS AND METHODS THEREFOR

(75) Inventors: Jelena Vuckovic, Palo Alto, CA (US);
Ilya Fushman, Palo Alto, CA (US);
Dirk Robert Englund, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 329 days.

(21) Appl. No.: 11/747,721

(22) Filed: May 11, 2007

Related U.S. Application Data

(60) Provisional application No. 60/799,768, filed on May 12, 2006.

(51) Int. Cl.
*H01S 3/16* (2006.01)
(52) U.S. Cl. ............... 372/41; 372/44.011; 372/46.013
(58) Field of Classification Search ................ 372/41, 372/46.013
See application file for complete search history.

(56) References Cited

U.S. PATENT DOCUMENTS 6,466,709 B1    10/2002    Scherer et al.
6,468,823 B1    10/2002    Scherer et al.
2005/0110992 A1*    5/2005    Scherer et al. ............. 356/318
2008/0224121 A1*    9/2008    Bose et al. ..................... 257/13

OTHER PUBLICATIONS

2001, E. Yablonovitch, "Photonic Crystals: Semiconductors of Light," Scientific American, 47-55 (2001).
D. Englund et al. "General recipe for designing photonic crystal cavities." Optics Express 13(16), pp. 5961-5975 (2005).
R. Lee et al. "Modified spontaneous emission from a two-dimensional photonic bandgap crystal slab." Journal of the Optical Society of America B 17, pp. 1438-1442 (Aug. 2000).
D. Englund et al. "Controlling the Spontaneous Emission Rate of Single Quantum Dots in a Two-Dimensional Photonic Crystal." Physical Review Letters 95, pp. 013904-1-013904-4 (2005).

* cited by examiner

*Primary Examiner*—Dung T Nguyen
(74) *Attorney, Agent, or Firm*—Crawford Maunu PLLC

(57) ABSTRACT

Optical microcavity arrangements and approaches facilitate a variety of applications. According to an example embodiment of the present invention, an optical microcavity arrangement includes a microcrystal structure having a plurality of optical cavities therein to facilitate the control of light. Emitters such as colloidal quantum dots are optically coupled to the optical cavities by attaching or otherwise arranging a material, which includes the emitters, to the optical microcavity arrangement. In many applications, the emitters couple photons of a wavelength in a range of wavelengths selectively passed by the optical cavities, and are amenable to operation at relatively high temperatures (e.g., at about room temperature or higher), which is useful for a variety of applications.

35 Claims, 8 Drawing Sheets

US 7,778,296 B1

OPTICAL MICROCAVITY EMITTER ARRANGEMENTS AND METHODS THEREFOR

RELATED PATENT DOCUMENTS

This patent document claims the benefit, under 35 U.S.C. §119(e), of U.S. Provisional Patent Application No. 60/799,768, filed May 12, 2006 and entitled: "Microcavity Emitter Arrangements and Methods Therefor."

FEDERALLY SPONSORED RESEARCH OR DEVELOPMENT

This invention was made with Government support under contract DAAD19-03-1-0199 awarded by the U.S. Army RDECOM Acquisition Center. The Government has certain rights in this invention.

FIELD OF THE INVENTION

The present invention relates generally to microcavity emitter arrangements and methods, and more particularly, to a quantum dot or nano-crystal emitter-coupled microcavity arrangements and methods.

BACKGROUND

Optical microcavities are used for controlling, confining or otherwise passing light for a variety of arrangements and applications such as lasers, optical memory devices, emitters and resonators. Generally, optical microcavities have a relatively thin layer in which light is passed, sometimes referred to as a spacer layer, with reflective material on faces of the thin layer to confine the light. These microcavity layers have dimensions on the scale of several hundred micrometers or less (thus the term "micro" in "microcavities"). In some applications, the microcavity layers are less than about one micrometer in thickness, and as such are sometimes referred to as nanocavities.

One type of microcavity used in many applications is the photonic crystal cavity. Photonic crystal cavities are particularly suited for controlling and confining light in scales on the order of a cubic wavelength of light. Photonic crystal cavities employ a crystal membrane material having a periodic arrangement of holes and exhibiting a photonic band gap, often referred to as a forbidden zone in which light of a particular wavelength range is blocked. Light entering the photonic crystal cavity refracts through and partially reflects off of interfaces between the crystal structure and air at each of the holes. Light is selectively passed through the crystal structure in accordance with the size and arrangement of holes (or lack of holes in certain locations), the light's wavelength, the light's direction of travel, and the refractive index of the crystal structure.

In this regard, by controlling the type of crystal structure and holes therein, photonic crystals can be used to affect the motion of light in a manner similar to the way in which semiconductors affect the motion of electrons. When used with light emitters, photonic crystals facilitate desirable control over the radiative properties of the emitters. High-Q cavities defined in photonic crystals confine photons to a small volume, facilitating large light-matter interaction, which can be useful in applications involving light sources, photodetectors, bio-chemical sensors, and quantum information processors. In these applications, the photonic crystal cavity enhances the generation rate for photons and also facilitates high collection efficiency.

For many crystal emitter applications, room-temperature operation is desirable for a variety of purposes. Certain photonic crystal arrangements such as photonic crystal cavity lasers and LEDs have had some success in achieving room-temperature operation. In addition, emitters such as nitrogen vacancy centers, CdSe quantum dot emitters, and single molecules can be used to generate single photons at room temperature for applications such as fluorescent labeling in biological imaging. However, such emitters are limited in application; as such, many photonic crystal cavity arrangements (e.g., single photon sources for quantum information processing) have relied upon other types of emitters that decay (e.g., cannot operate) at room temperature, often requiring implementation at cryogenic temperatures. Such temperature dependency limits the usefulness of these photonic crystal cavity arrangements and tends to increase the cost of their use.

The usefulness of room-temperature emitters has also been limited due to difficulties in coupling the emitters to acceptable photonic crystal cavities. For instance, many such emitters are in nanocrystalline form and cannot be directly incorporated in a semiconductor or dielectric material, such as that employed by a photonic crystal or other cavity. In addition, emitters operating at visible or near-visible wavelengths have been difficult to combine with cavities employing high index semiconductor material.

In addition to the above, photonic crystal-based lasers (which operate at room temperature) have suffered from inefficiencies due to non-radiative surface recombination losses at exposed semiconductor surfaces. This problem is particularly salient in photonic crystal structures in which quantum wells expose a relatively high surface area. Furthermore, photonic crystal lasers have also been susceptible to heating problems similar to those that have presented challenges to many semiconductor laser applications.

These and other characteristics have presented challenges to the implementation of microcavity arrangements such as photonic crystal cavity arrangements and others.

SUMMARY

The present invention is directed to approaches, devices and applications that overcome challenges including those mentioned above, and as related to applications discussed above and others. These and other aspects of the present invention are exemplified in a number of illustrated implementations and applications, some of which are shown in the figures, discussed below and/or characterized in the following claims.

According to an example embodiment of the present invention, an optical microcavity arrangement includes a microcrystal structure and an emitter material thereon. The microcrystal structure has cavities arranged therein to selectively pass light having a wavelength that is in a range of sub-micron wavelengths and to inhibit the passage of light having other wavelengths. The emitter material is located on the microcrystal structure and includes emitters arranged therein to couple photon emissions to the cavities in the range of wavelengths.

In another example embodiment of the present invention, a laser device includes a microcrystal structure and a protective layer. The microcrystal structure includes a plurality of light-passing cavities to facilitate the passage of laser light. The protective layer is located on the microcrystal structure, protects the microcrystal structure (e.g., from oxidation or contamination) and includes a plurality of emitters optically coupled to the cavities to enhance the gain of laser light at the cavities.

According to another example embodiment of the present invention, a biological detection arrangement includes a microcrystal structure, a plurality of emitters and an emission detector. The microcrystal structure includes a plurality of cavities that selectively pass light. Each emitter is connected to a biological material and optically coupled to one of the cavities. The detector is arranged to detect photon emissions from the emitters for use in detecting a characteristic of the biological material (e.g., to detect the presence of and/or identify the biological material).

According to another example embodiment of the present invention, a quantum information processor uses an emitter layer optically coupled to a microcrystal structure to store and/or process light data. The optical microcrystal structure has a plurality of optical microcavities to selectively pass light having a wavelength that is in a range of wavelengths (e.g., sub-micron wavelengths including visible or near-infrared wavelengths), and to inhibit light in other wavelengths. An emitter layer is located on the optical microcavity and has emitters arranged therein to couple photon emissions to the optical cavities in the range of wavelengths at or near room temperatures (e.g., at or above a range of about 20-25° C., and in some applications, at or above about 0° C.). A light detector detects photons from the emitters and outputs a signal in response to the detected photons, and a microprocessor uses the signal and characteristics of the arrangement of the optical cavities to process data.

In another example embodiment of the present invention, an optical microcavity arrangement includes a microcrystal structure having photonic cavities arranged therein and a capping layer to protect the microcrystal structure. The capping layer is located on the microcrystal structure to mitigate contamination of the microcrystal structure and facilitate increased heat exchange between the microcrystal structure and a surrounding environment, relative to the heat exchange exhibited by the microcrystal structure without the capping layer.

According to another example embodiment of the present invention, a method for manufacturing an optical microcavity arrangement includes providing a microcrystal structure having optical cavities arranged therein to selectively pass light in a range of sub-micron wavelengths, and depositing a solution including emitters onto the microcrystal structure to optically couple photon emissions from the emitters to the optical cavities.

In another example embodiment of the present invention, a photonic crystal cavity arrangement is manufactured as follows. A microcrystal layer is formed on a semiconductor substrate and holes are formed in the microcrystal layer to define optical cavities therein. The semiconductor substrate is oxidized, and a solution including emitters is deposited onto the microcrystal layer to optically couple the emitters to the optical cavities. In some applications, the solution is deposited before oxidation of the semiconductor substrate, and in other applications, after oxidation of the semiconductor substrate.

In another example of embodiment of the present invention, a photonic crystal arrangement is manufactured as follows. An emitter doped polymer is spin cast on a substrate and holes are formed in the polymer. In some applications, the high index of the emitter-doped polymer defines a photonic bandgap for the arrangement. In other applications, the emitter-doped polymer becomes part of the photonic crystal (with the index effectively transferred partially to the substrate).

The above summary is not intended to describe each illustrated embodiment or every implementation of the present invention.

BRIEF DESCRIPTION OF THE DRAWINGS

The invention may be more completely understood in consideration of the following detailed description of various embodiments of the invention in connection with the accompanying drawings, in which.

Figure 1A:
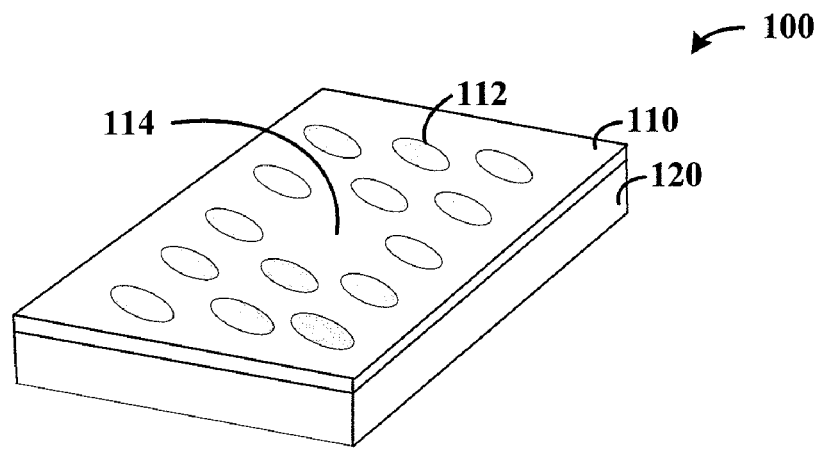
FIGS. 1A and 1B respectively show perspective and cross-sectional views of a microcavity arrangement at stages of manufacture, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention, including that described in the claims.

DETAILED DESCRIPTION

The present invention is believed to be applicable to a variety of microcavity arrangements and approaches for implementing the same. While the present invention is not necessarily limited to such applications, an appreciation of various aspects of the invention is best gained through a discussion of examples in such an environment.

According to an example embodiment of the present invention, optical microcavity arrangements are implemented with emitters that are optically coupled to a crystal structure having microcavities therein. The microcavities selectively pass light having a wavelength in a limited range of wavelengths (i.e., the microcavities exhibit a photonic bandgap). In this regard, the emitters and microcavities are optically coupled for pass photons within this wavelength range.

In some applications, the emitters are dissolved or suspended in a solution to form a colloid, and the colloid (or a portion thereof) is subsequently applied in a layer or otherwise introduced to the crystal structure. For instance, certain applications are directed to spinning a colloidal solution onto a microcrystal structure such as a photonic crystal membrane, to optically couple emitters in the colloidal solution to optical microcavities in the microcrystal structure. Using these approaches and related arrangements, various light sources such as lasers, light emitting diodes, and single photon sources are formed and implemented.

In one embodiment, the microcavity arrangement facilitates the emission and coupling of photons near or above room temperature. Colloidal quantum dots are arranged to optically couple photons to the microcavities, which are of a shape and arrangement, relative to the wavelength of the photons, to facilitate room temperature operation (emission). In some applications, PbS (lead sulfide) quantum dots and/or another type of colloidal quantum dots such as PbSe (lead selenide) are implemented with the microcavity arrangement to facilitate operation over a broad wavelength range.

In other example embodiments, nanoemitters are used to characterize and/or analyze passive structures such as a photonic circuit element in a microcavity-type arrangement. Nanoemitters such as quantum dots are selectively deposited onto or otherwise arranged near the passive structures (e.g., formed in a low index polymer) and emit a photon that can be used, for example, in mapping the resonances of the passive structures.

Other example embodiments are directed to the use of colloidal quantum dots, such as the PbS quantum dots described above, as fluorescent labels in biological imaging applications. The colloidal quantum dots are arranged relative to a microcrystal structure and emit photons that are readily detected and used to identify the presence (or absence) of a particular biological specimen. For example, a microcrystal structure can be used to enhance emission and/or collection efficiency from the colloidal quantum dots (e.g., as selectively coupled to a target molecule bound to or in the vicinity of a resonant cavity of the microcrystal structure).

Other example embodiments employing colloidal quantum dots are directed to the use of the colloidal quantum dots in photodetector or solar cell applications. The arrangements of colloidal quantum dots relative to a microcrystal structure increases their absorption at particular range of wavelengths, which is useful for photodetectors or solar cells.

Various microcavity arrangements are used in connection with one or more example embodiments of the present invention. For instance, microemitters such as quantum dots are selectively coupled to one or more of photonic crystal cavity arrangements (e.g., as discussed above), micro-disk cavities fabricated in AlGaAs, and other microcavity arrangements. For simplicity, many example embodiments, applications and implementations described herein refer to photonic crystal cavity approaches; however, such approaches are applicable to a variety of microcavities including both those mentioned here and others as would be understood by those of skill in the related art. In addition, the terms microcavity and nanocavity are both used and may be used interchangeably to refer to arrangements on the micrometer scale (e.g., having dimensions of less than or about 1000 micrometers) and on the nanometer scale (e.g., having dimensions less than or about 1000 nanometers). For various example embodiments, the terms microcavity and nanocavity are also used to refer to a microcrystal arrangement such as a photonic crystal membrane having one or more optical cavities therein (i.e., the microcrystal makes up a microcavity in the form of a layer or membrane).

In addition to a variety of microcavity arrangements being applicable for use with different example embodiments described herein, many different types of nanoemitters are also applicable for use in various example embodiments, and in many applications, may be interchangeably used with those described in order to suit particular applications. For instance, some applications are directed to the use of diamond nanocrystals with nitrogen vacancies which emit light around 650 nm, or other types of nanocrystals, in place of and/or in addition to those applications directed to the use of quantum dot nanoemitters. In addition, various embodiments are directed to the use of emitters that emit photons at sub-micron wavelengths (i.e., at wavelengths of less than or about one micrometer).

Further regarding terminology used in this patent document, the term colloid generally refers to a substance with components of one or two phases. In some applications, a colloid refers to a mixture, with particles such as quantum dot or nanocrystal emitters mixed in another substance. In this regard, the colloids and mixtures used herein often refer to a mixture of nano-particles (i.e., particles having a size of less than about 1000 nanometers) distributed in another material. For certain applications, such nano-particles are distributed throughout a material that is readily applied as a layer to a photo crystal structure.

In other example embodiments, a microcavity arrangement as described herein is used to form lasers emitters that are based upon gain from semiconductor quantum wells. The microcavity is protected with a coating that generally does not affect properties of the microcavity and, correspondingly, facilitates laser emission without any inhibitions due to the coating. In one implementation, a polymer-resist coating such as Polymethyl methacrylate (PMMA) is used to protect the microcavity from undesirable conditions, such as oxidation and/or contamination as may be related, for example, to surface passivation processes implemented to mitigate non-radiative losses at a photonic crystal surface of the microcavity. For certain embodiments, the coating also includes emitters such as quantum dots or other nanoemitters to facilitate emissions from the microcavity arrangement.

In some embodiments, a polymer coating such as that described above is used to facilitate heat exchange with microcavity arrangements such as lasers that are susceptible to heat or otherwise benefit from heat exchange. Such a coating may or may not include emitters, and as such is applicable to a variety of non-emitter applications as well as the emitter-based applications described herein. In some implementations, the coating is used to protect a microcavity arrangement during operation under conditions that involve heating, such as those involving laser heating as part of and/or as a consequence of operation of the microcavity arrangement. The coating maintains the microcavity intact under relatively high laser heating power, and in some applications, is used to maintain the microcavity under heating power conditions that are five times or more greater than could be sustained by the microcavity, without the coating.

In other implementations, a coating is applied to an upper portion of a microcavity such as a photonic crystal membrane, and a lower portion of the microcavity is oxidized to facilitate similar heat exchange at the lower portion. The coating is used to protect and/or cap the upper portion to symmetrize the index of the microcavity for better light confinement and suppression of multimode operation due to modes that arise in an asymmetric structure.

For general information regarding microcavities, and for specific information regarding the application of coatings and other approaches as may be implemented in connection with one or more example embodiments, including those directed to heat dissipation, reference may be made to Dirk Englund, Hatice Altug, Jelena Vuckovic, *Low-Threshold Surface-Passivated Photonic Crystal Nanocavity Laser*, at Cornell University Library (arXiv:quant-ph/0703198v2), Mar. 21, 2007, which is fully incorporated herein by reference.

Figure 1B:
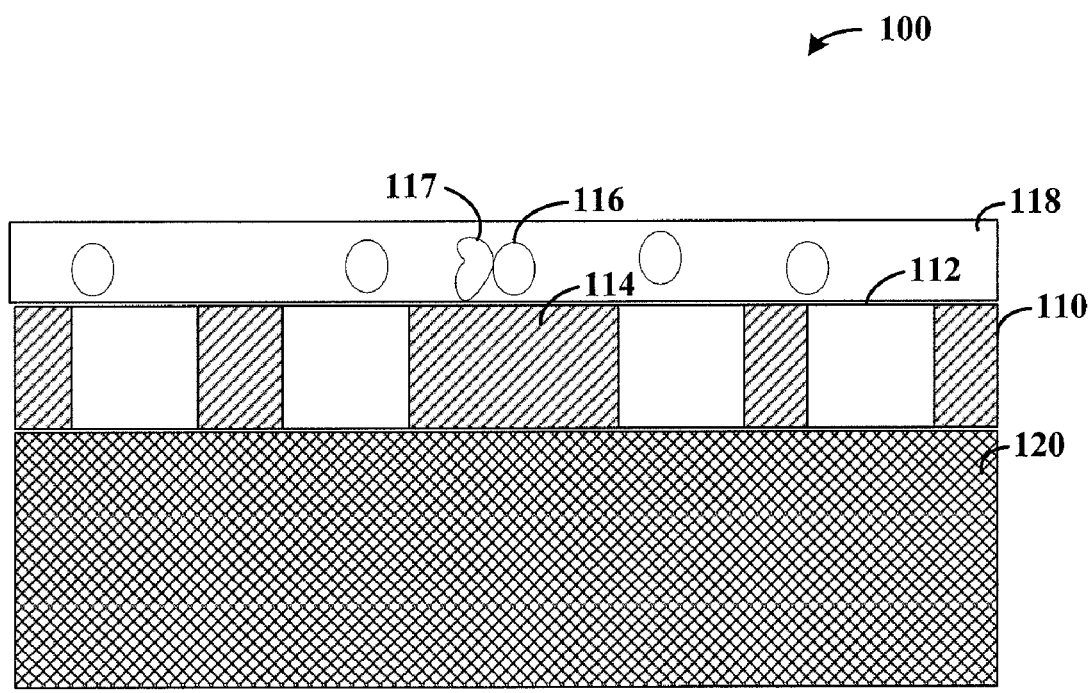

Turning now to the figures, FIG. 1A shows a perspective view of a photonic crystal cavity arrangement 100 having a photonic crystal membrane 110 on a substrate layer 120, according to an example embodiment of the present invention. FIG. 1B shows a corresponding cross-sectional view the arrangement 100 at a later stage of manufacture, with a polymer layer 118 on the photonic crystal membrane.

The photonic crystal membrane 110 defines a periodic array of holes including hole 112 (labeled by way of example) that exhibit a dielectric value that is different from the dielectric value of the photonic crystal membrane 110. The photonic crystal membrane 110 further includes one or more photonic crystal cavities, which are formed (or defined) by variations or defects in the arrangement of the holes, such as the absence of a hole. An example cavity location 114 is shown in FIG. 1A, resulting from an inconsistency in the periodic arrangement of the holes (i.e., as the absence of a hole). Generally, the cavity 114 (and others in the arrangement 100) selectively pass light having a particular wavelength, and mitigate the passage of light in other wavelengths (i.e., the cavity exhibits a photonic bandgap). In this regard, the holes and cavities are arranged to facilitate the confinement of light and, as appropriate, other light control characteristics.

Characteristics of the photonic crystal membrane 110 are varied to suit different applications, such as for lasers, optical logic devices, biological detectors, photodetectors, single photon sources, research into such membranes and testing of active or passive optical devices. In some embodiments, the holes defined in the photonic crystal membrane 110 are set in size, or varied in size relative to one another, to create and define the photonic crystal cavity and its behavior relative to light. In other embodiments, characteristics such as the thickness of the photonic crystal membrane 110, the membrane material, the quantity of holes, the size of the holes and the arrangement of the holes in the photonic crystal membrane 110 affect the optical properties of the membrane.

In one embodiment, the photonic crystal membrane 110 has cavities therein formed with a relatively high optical field intensity in a low-index region (e.g., at holes) so that quantum dots can be positioned in the region where the field is strong to facilitate strong interaction between the field and the emitted light from the quantum dots.

Referring to FIG. 1B, the polymer layer 118 includes a polymer having emitters 116 mixed therein, and is formed on or otherwise connected to the photonic crystal cavity membrane 110. The quantity, type and arrangement of the emitters 116 are selected to suit particular applications. For example, the emitters may include PbS quantum dots, PbSe quantum dots, nanocrystals or others such as those described above. In some applications, the emitters 116 emit at a common wavelength selected for the particular application, and in other applications, the emitters include emitters that emit at different wavelengths. The number, or density, of the emitters 116 in the polymer layer 118 is also set to facilitate desirable emission characteristics.

The polymer layer 118 is formed to a thickness to suit the particular application as well. In one example embodiment, the thickness of the polymer layer 118 is set (i.e., increased) to facilitate an increase of the symmetry of the photonic crystal cavity arrangement, thereby increasing the confinement factor. Where the increased thickness also results in increased emissions from dots that are not coupled (optically) to the photonic crystal cavity arrangement, a second polymer layer without quantum dots (or other emitters) is selectively applied to (e.g., spun on) the photonic crystal cavity arrangement in order to cap the emitting layer.

In some embodiments, the polymer layer 118 is a protective layer that protects the crystal membrane 110, such as from oxidation or contaminants, or from heat under certain conditions. In certain applications, the polymer layer 118 protects the crystal membrane 110 from heat by facilitating an increase in heat transfer from the crystal membrane 110 of two, five or more times heat transfer exhibited by the crystal membrane 110, absent the polymer layer. In other applications where implemented as a protective layer, the polymer layer 118 is devoid of emitters as shown (i.e., is used primarily as a protective layer, such as to facilitate heat dissipation in laser devices).

The photonic crystal cavities in the crystal membrane 110 are arranged to facilitate the emission of light from an emitter 116 optically coupled to the cavity. Thus, emissions from the emitters that are aligned with the cavities are increased relative to the emissions from the emitters coupled to the photonic crystal membrane outside of a photonic crystal cavity (e.g., between holes or at other locations).

In one embodiment, the polymer layer 118 is removed from the areas outside of the photonic crystal cavity using a removal process such as electron-beam lithography. This removal results in the emissions originating from substantially within the photonic crystal cavities, thereby facilitating emitter-cavity coupling and related properties of the resulting light sources (such as lasers or single photon sources). In some applications, this approach is used in connection with the integration of active (e.g., light sources) and passive (e.g., waveguides, filters) components on the same chip.

In some applications, the material for the photonic crystal cavity structure is selected to reduce absorption losses at the target quantum dot sub-micron wavelength. For example, fabricated crystals in AlGaAs have minimal absorption of light at a wavelength of 850-950 nm and are therefore suitable for PbS quantum dots. For diamond nanocrystals emitting at near 650 nm, the photonic crystals are selectively fabricated in gallium phosphide or silicon nitride rather than AlGaAs, which absorbs more light at 650 nm. In these and other example embodiments herein, sub-micron wavelengths refer to wavelengths that of about one micrometer or less.

In another example embodiment, the photonic crystal cavity arrangement 100 is implemented for biological applications, using the emitters to connect to target biological material. By way of example, a molecule 117 is shown with the emitter 116 connected thereto. When light is passed via the optical cavity 114 of the photonic crystal membrane 110, the emitter 116 fluoresces (i.e., emits a photon). This emission is detected and used to detect the presence of the molecule 117 and, in some applications, to identify the molecule 117 (e.g., where a particular type of molecule in the polymer layer 118 is known to selectively bond to the emitter 116).

Figure 2:
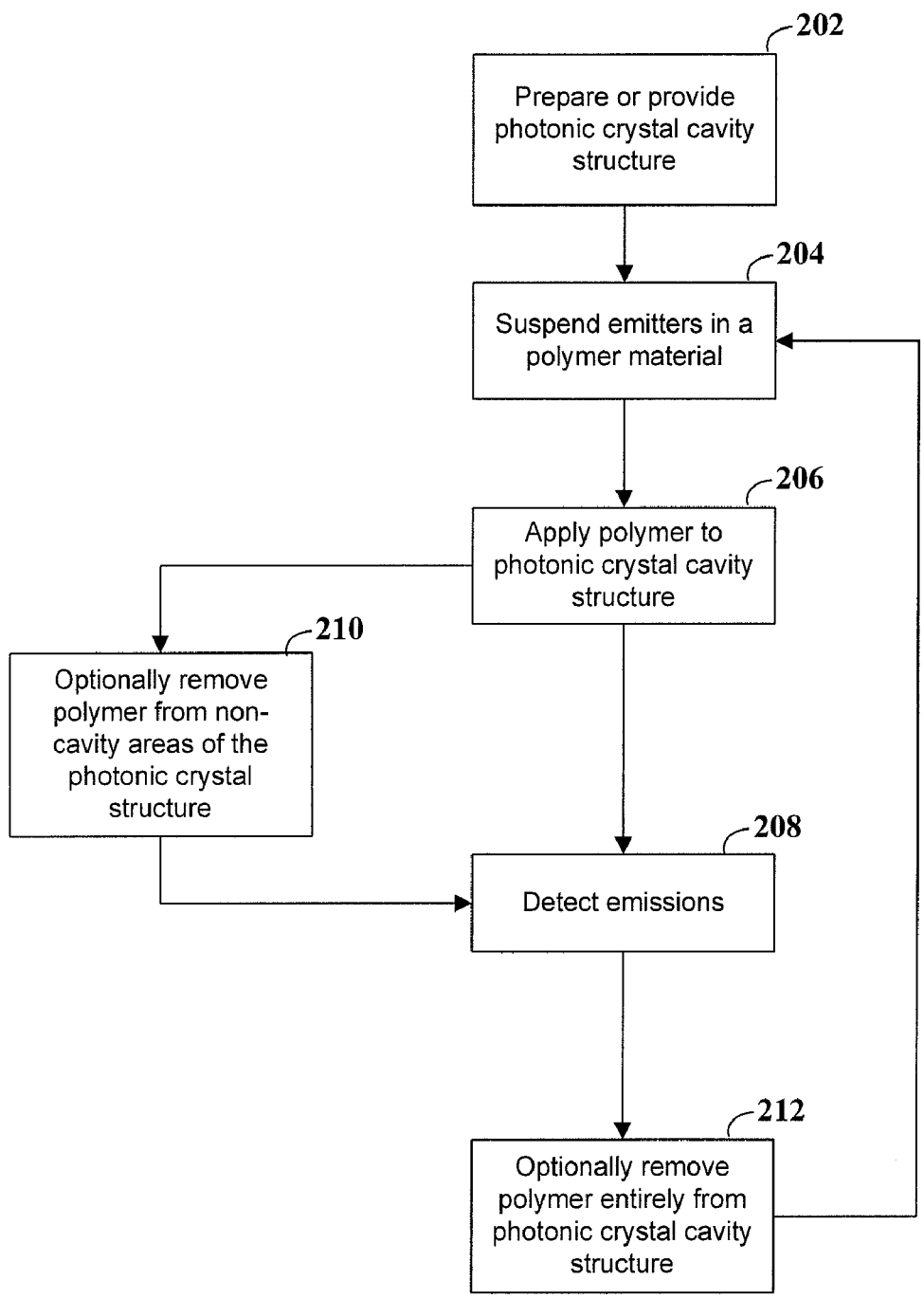
FIG. 2 is a flow diagram for an approach to microcavity-based analysis, according to another example embodiment of the present invention.

FIG. 2 is a flow diagram showing an approach to forming and performing analysis with a photonic crystal cavity arrangement, according to another example embodiment of the present invention. At block 202, a photonic crystal cavity arrangement having a photonic crystal layer with a periodic array of alternating dielectric materials, such as that shown in FIG. 1A, is constructed or otherwise obtained. The photonic crystal layer includes one or more defects or cavities within the array.

At block 204, quantum dots (or emitters of another type) are suspended in a polymer such as PMMA. The density of the quantum dots within the polymer is set relative to a desired quantity of quantum dots to be applied to the photonic crystal layer. For example, when implemented for devices benefiting from a significant amount of light such as a laser or light-emitting diode (LED), a relatively large number (thus high density) of quantum dots is suspended in the polymer. When implemented with a device benefiting from a low amount of light such as those employing single photon generation, a relatively lower number (thus low density) of quantum dots is suspended in the polymer.

The polymer and quantum dot mixture is applied to the photonic crystal layer at block 206. In some applications, the mixture is selectively applied to some or all portions of the photonic crystal layer. In other applications, the polymer mixture is applied in a layer using centrifugal force to "spin" the layer onto the photonic crystal layer. The thickness of the polymer layer is set for different applications, and when spinning the layer onto the photonic crystal layer, the thickness is set using different centrifugal forces corresponding to the rate at which the polymer mixture is spun on. Using these approaches, the suspended quantum dots are coupled to one or more photonic crystal cavities in the photonic crystal layer.

Once the polymer and emitter mixture is applied to the photonic crystal layer at block 206, the photonic crystal cavity arrangement is used in analysis for a variety of purposes. A light detector is used to detect emissions from quantum dots or other emitters coupled to the photonic crystal cavity structure as shown at block 208. The monitoring results are selectively used for a variety of purposes including single photon generation for quantum information processing, measurements on single photonic crystal cavities, detection of characteristics of active or passive devices coupled with or formed by the photonic crystal layer, and fluorescent labels in biological imaging applications. In some applications, the monitoring results are used to determine photonic crystal cavity characteristics, and in other applications, to monitor single photon emissions from the quantum dot emitters.

In some applications, portions of the polymer and quantum dot mixture are removed from the non-cavity areas of the photonic crystal cavity structure at block 210, prior to and/or after monitoring at block 208. This approach is particularly applicable in instances where the polymer and quantum dot mixture is applied in a layer, such as via spin-coating as described above. By removing the polymer layer from the non-cavity areas, the ratio of light emitted from emitters coupled to photonic crystal cavities to those emitters that are not coupled to photonic crystal cavities is increased, facilitating the detection of emissions at block 208.

In applications where the photonic crystal cavity structure is to be used with another emitter-analysis approach, the polymer layer is removed (completely or in part) from the photonic crystal cavity arrangement at block 212. For example, a polymer mixture can be removed by dipping the photonic crystal cavity structure into organic solvent such as acetone. After the layer is removed, the photonic crystal cavity arrangement can be used in a different application, with the process optionally continuing again at block 204 to apply a new mixture with emitters to the photonic crystal layer. With this approach, the same photonic crystal cavity arrangement can be used with different polymers (or other suspension material), different mixture layer thickness, different emitters and different applications. Moreover, certain applications involve the iterative detection of light using different emitters to characterize the photonic crystal cavity arrangement (e.g., by mapping out characteristics or verifying the quality of the photonic crystal cavity arrangement). With these approaches, photonic crystal or other micro- or nanocavity arrangements are made reusable, via the ability and approach to removing such a polymer (or other) layer with nanocrystal emitters, and replacing the layer with another layer having emitters.

Figure 3:
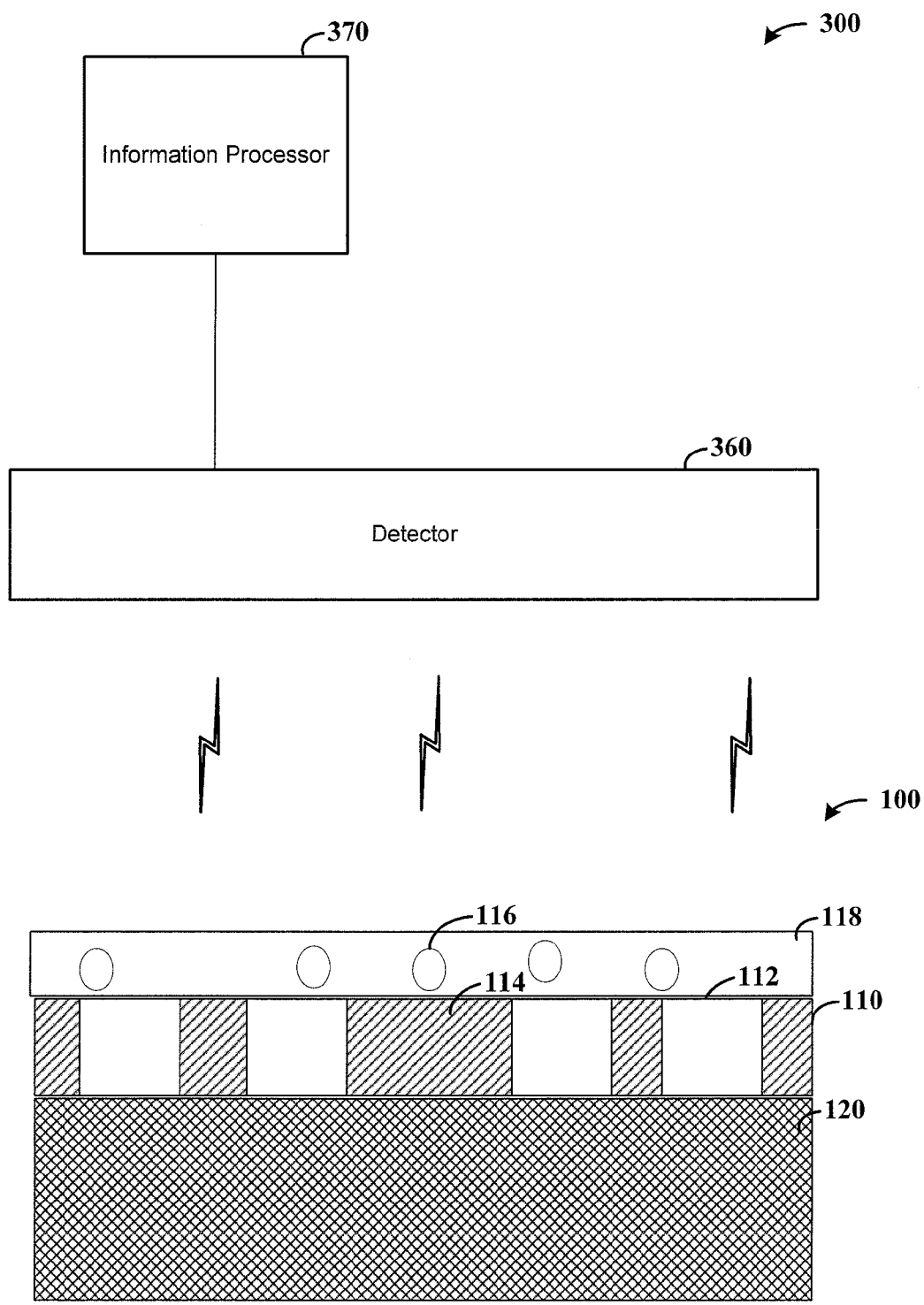
FIG. 3 is block diagram of a microcavity arrangement, according to another example embodiment of the present invention.

FIG. 3 shows a photonic crystal cavity detector arrangement 300 used to monitor the emissions from a photonic crystal cavity structure, according to another example embodiment of the present invention. For brevity, the arrangement 300 is shown implemented with the photonic crystal cavity arrangement 100 shown in FIG. 1B, also shown here by cross-section. The arrangement 300 includes a detector 360 that collects light emitted from the photonic crystal cavity arrangement 100 and a processor 370 that processes data characterizing the detected light and provided by the detector. The detector 360 collects light data such as the intensity, wavelength, and position of light emitted from the photonic crystal cavity arrangement 100. In some applications, the detector detects single photons, such as for quantum information processors, sensors and others.

In connection with a specific example embodiment of the present invention and as may be implemented in connection with the approaches shown in and described in connection with FIGS. 1A-2, quantum dots are optically coupled to semiconductor photonic crystal cavities at room temperature as follows. Photonic crystal cavities are formed using a 160 nm thick AlGaAs (33% Al) membrane (i.e., a photonic crystal membrane) on top of an AlAs substrate of about 500 nm in thickness. The cavities are defined using 3% 450 K molecular weight (KmW) Poly-methyl-methacrylate (PMMA) with an electron beam lithography approach. The patterns are transferred from PMMA developed in 3:1 Methyl Isobutyl Ketone (MIBK) to the membrane with an electron-cyclotron resonance (ECR) plasma etch process. The substrate is then oxidized at 420° C. for 10 minutes in the presence of water vapor in order to create an index contrast of about 3.4:1.8 between membrane and substrate. PbS quantum dots emitting light at of a wavelength of between about 850 nm and 950, such as those available from Evident Technologies, are dissolved or suspended in 1% 75 KmW PMMA at a concentration of about 0.1 mg/ml in toluene and spun onto the membrane.

Figure 4:
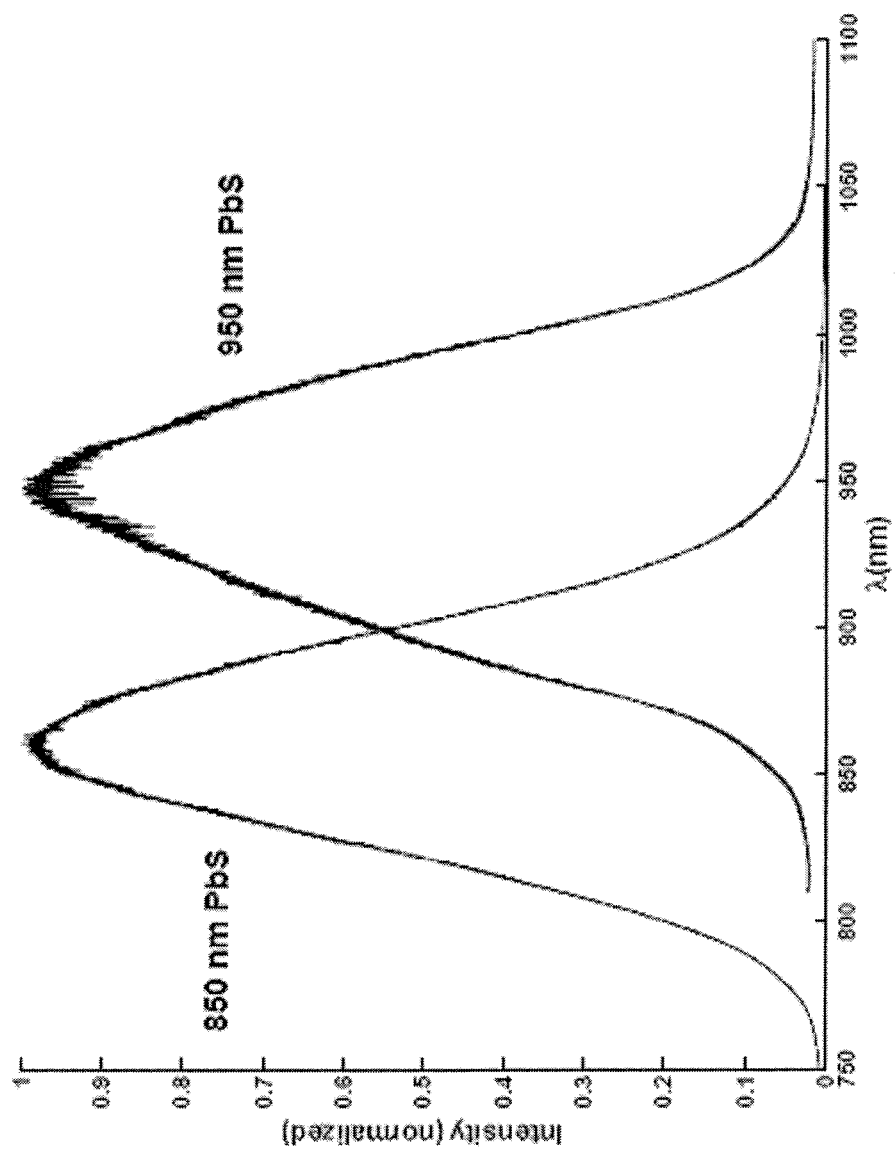
FIG. 4 shows bulk spectra emissions from a photonic crystal cavity arrangement, according to another example embodiment of the present invention.
Figure 6:
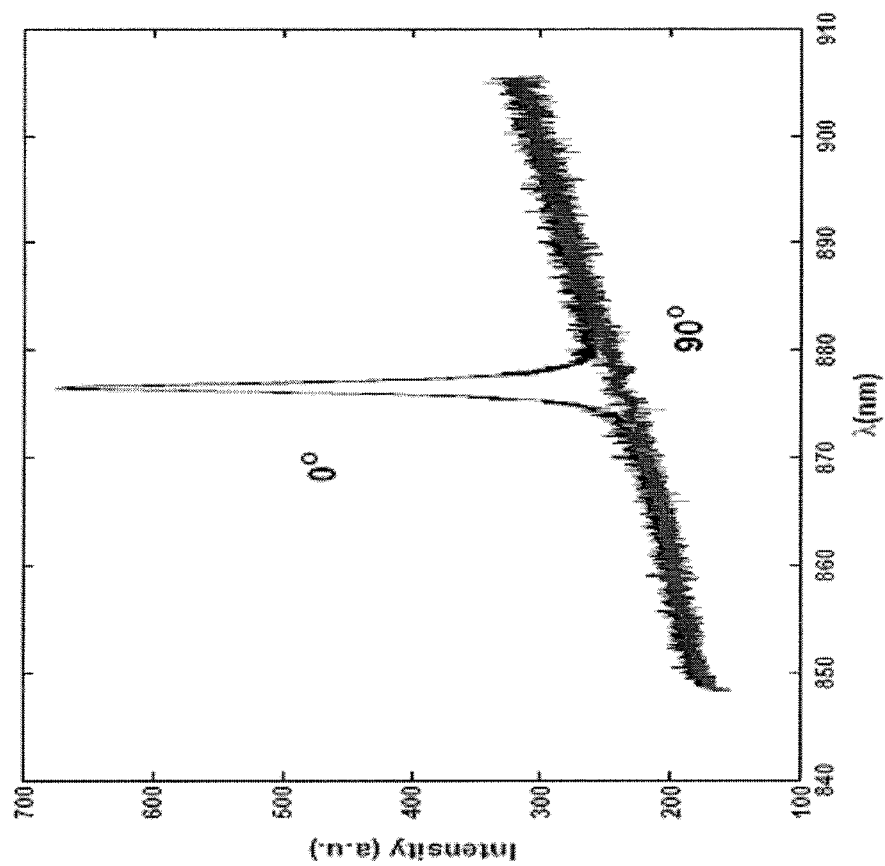
FIG. 6 shows emitted light intensity from a photonic crystal cavity arrangement, according to another example embodiment of the present invention.
Figure 5:
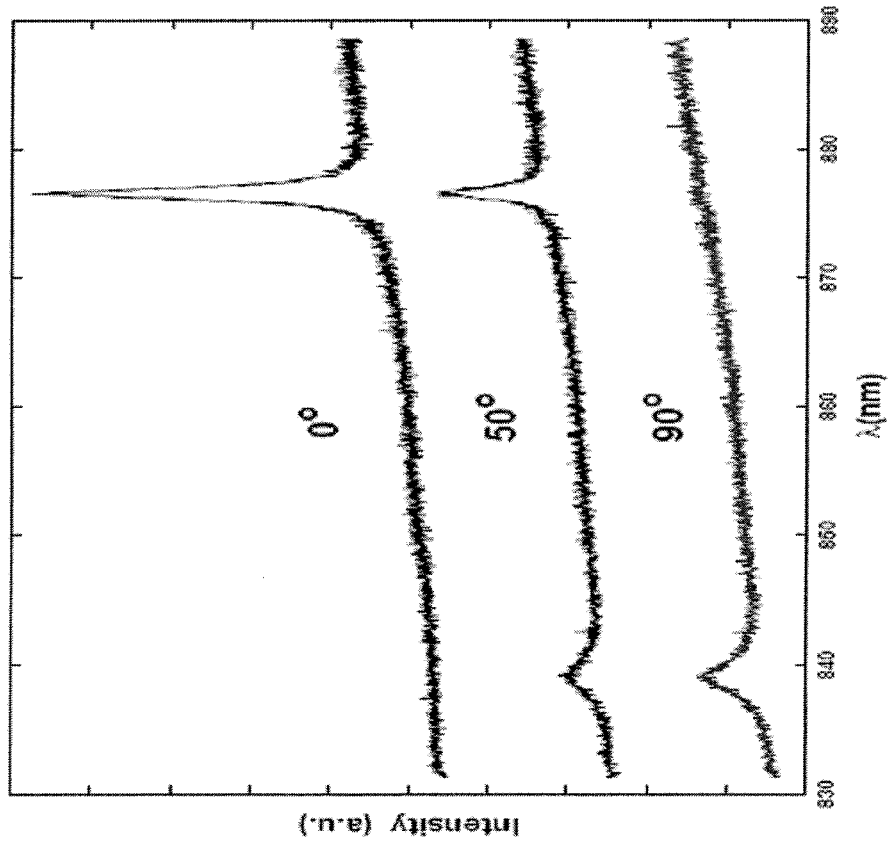
FIG. 5 shows emitted light intensities of varying wavelengths and polarizations from a photonic crystal cavity arrangement, according to another example embodiment of the present invention.

FIG. 4 shows a plot of example bulk spectra implemented with an approach similar to that described in the preceding paragraph, according to an example embodiment. The quantum dots can be kept under vacuum and excited with femto-second light pulses, such as laser pulses from a titanium-sapphire laser emitting light at 760 nm. Example plots of cavity spectra collected under such pulsed excitation are shown in FIG. 5 and FIG. 6, showing two orthogonally-polarized modes. The linearly increasing background observed on the spectra can be explained by considering the emission profile of the quantum dots and the reflectivity of the PMMA/AlGaAs/AlOx structure, which leads to an almost linear emission profile of dots on the AlGaAs slab. The coupling between a cavity and emitter depends on both the spatial alignment and the orientation of the emitter dipole moment relative to the cavity field. The cavities used support two dipole type (electric field primarily polarized in x and y) cavity modes with maxima in a central hole.

The quality factor (Q) for such cavities can be written as $$1/Q = 1/Q_{\text{in-plane}} + 1/Q_{\text{out-of-plane}}$$

The above description separates the cavity losses into an out-of-plane loss which leads to directly observed emission, and losses into the Bragg mirrors in the plane of the two dimensional crystal. Certain example cavities as described here have observed x-dipole Q's≈400 and y-dipole Q's≈200; the in-plane Q is respectively about 450 and 400 for these modes, and thus limits the total Q. The center hole sidewalls are not vertical because of a reduced etch rate for smaller features and a lower dose delivered to the PMMA due to proximity effects. Since this hole is in the region of high electric field, imperfections will reduce the quality factor. In a perfectly symmetric cavity, where the two holes above and below the defect are unperturbed, the x and y modes are degenerate. The four holes are shifted in order to increase the Q factor for the x dipole mode. In some applications, Q-factors are improved in this cavity by further manipulating one or both of design and fabrication, in connection with these approaches.

As described above, various embodiments are directed to the enhancement or reduction of spontaneous emission (SE) rates for quantum dots or other emitters used in connection with a microcavity arrangement. In some applications, enhancement is implemented for photon generation and spectroscopy applications to facilitate increased signal rate and strength. The Purcell factor $$F = \frac{\Gamma c}{\Gamma o}$$

is applicable here, where $\Gamma c$ is the emission rate in the cavity and $\Gamma o$ is the emission rate outside of the cavity. The observed spontaneous emission rate for an emitter with dipole moment $\vec{\mu}$ at a point on the cavity can be derived from Fermi's Golden rule, and the total emission rate takes the form:

$$\frac{\Gamma c}{\Gamma o} = Fc\left(\frac{\vec{E}\cdot\vec{\mu}}{|\max\{\vec{E}\}||\vec{\mu}|}\right)^2 \frac{\Delta\lambda_c^2}{\Delta\lambda_c^2 + 4(\lambda-\lambda_c)^2} + Fpc$$

$\vec{E}$ is the electric field at the position of the emitter and $\Delta\lambda$ is the detuning from the cavity resonance wavelength $\lambda c$. For an emitter that is on resonance with the cavity and has a dipole moment aligned with the field:

$$Fc = \left(\frac{3\lambda_c^3 Q}{4\pi^2 n^3 Vm}\right)$$

Vm is the cavity mode volume and is calculated from Finite-Difference Time-Domain (FDTD) simulation results, with E as the position dependent dielectric constant, as:

$$Vm = \int \frac{\varepsilon|\vec{E}|}{\max\{\varepsilon|\vec{E}|^2\}} d^3\vec{r}$$

For this cavity, the volume has a value of Vm=0.96($\lambda_c^3/n^3$), where n is the index in AlGaAs. The term $F_{PC}$ describes the modification of the SE rate due to the presence of the photonic crystal lattice and modes other than the cavity mode. This modification results in a suppression of emissions. The cavity mode volume can be derived from FDTD calculations, and with the cavity Q derived from the spectra, FC is calculated at approximately 30. An average value of the suppression $F_{PC}$ is also derived from the data. The total intensity collected by the spectrometer $I_\emptyset$ is given by the aforementioned emission rate formula, integrated over the spatial and spectral density of the emitters.

$$I\phi = \Gamma_0 \int d\vec{\mu} \int d\lambda \int d^3\vec{r} \left\{ \eta c Fc \cos(\phi)\left(\frac{\vec{E}\cdot\vec{\mu}}{|\max\{|\vec{E}|^2\}||\vec{\mu}|}\right)^2 \frac{\Delta\lambda_c^2}{\Delta\lambda_c^2 + 4(\lambda-\lambda_c)^2} + \eta\, oFpc \right\} \rho(\lambda, \vec{r}, \vec{\mu})$$

Where Ø is the value of the polarizer angle, ηc is the collection efficiency due to the cavity radiation profile, η0 is the collection efficiency from an emitter embedded in the PMMA layer and uncoupled to the cavity, $\rho(\lambda, \vec{r}, \vec{\mu})$ contains the spectral and spatial distribution of the dots and the orientations of their dipole moments. The value of ηc can be estimated from numerically integrating the photonic crystal emission profile over the numerical aperture (NA) of the lens, and ηC is approximately 8%. The coupling efficiency of the bulk emitter is given by the integral over the sub-critical solid angle defined by the NA of the objective lens (e.g., of a detector as shown in FIG. 3):

$$\eta o = \frac{1}{4\pi}\int_0^{2\pi} d\phi \int_0^{\arcsin\left(\frac{NA}{nPMMA}\right)} \sin(\theta) d\phi \approx 3\%$$

(Where NA=0.5 and nPMMA=1.5).

Since the cavity modes are primarily linearly polarized, the ratio of the integrated intensities for polarizer angles of 0° and 90° results in:

$$R = \frac{I_0}{R_{90}} \approx$$

$$1 + Fc\frac{\eta c}{\eta o} * \frac{\int d\vec{\mu}d\lambda d^3\vec{r}\rho(\lambda, \vec{r}, \vec{\mu})\left(\frac{\vec{E}\cdot\vec{\mu}}{|\max\{|\vec{E}|^2\}||\vec{\mu}|}\right)^2 \frac{\Delta\lambda_c^2}{\Delta\lambda_c^2 + 4(\lambda-\lambda_c)^2}}{\int d\vec{\mu}d\lambda d^3\vec{r}FPc\, \rho(\lambda, \vec{r}, \vec{\mu})}$$

Using the value of FC and the x-dipole field, the average value of $F_{PC}$ over the lattice around the cavity can thus be estimated from the spectra. Assuming random dipole orientation, the integral over $\vec{\mu}$ gives ⅓. The spectral distribution of the dots to be Gaussian and centered at 850 and 950 nm is taken with a FWHM of 100 nm. The cavity line shape is Lorentzian with a FWHM of 2 nm. Only dots which are excited by the pump are contributing to the intensity, and so the spatial density corresponds to the excitation of a uniform dot distribution by a Gaussian pulse with a FWHM of 600 nm in the x, y plane and uniform in z, since the layer is thin relative to the focal depth. The integral over the field is done numerically with the simulated cavity field components. The spectral data shown in FIG. 5 results in a value of R approximately equal to 1.07. Using the value of FC=30, $F_{PC}$ is estimated to be 0.6.

Thus, for the coupling of PbS quantum dots dissolved in PMMA to photonic crystal cavities at room temperature, the dot emission maps out the cavity resonances and are enhanced relative to the bulk emission by a Purcell factor of 30. Using the emission spectra with and without cavity lines, a photonic crystal lattice spontaneous emission rate modification of approximately 0.6 is derived.

Figure 7A:
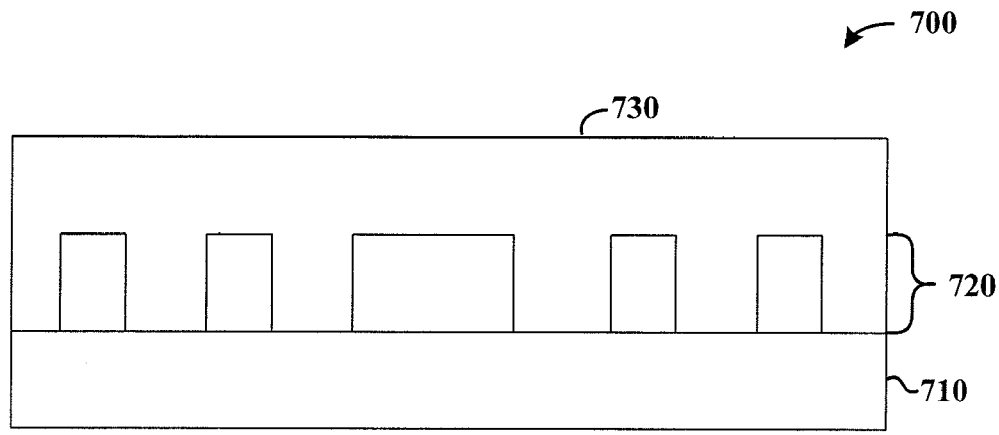
FIGS. 7A-7B show an approach to forming emitters in an optical microcavity arrangement, according to another example embodiment of the present invention.
Figure 7B:
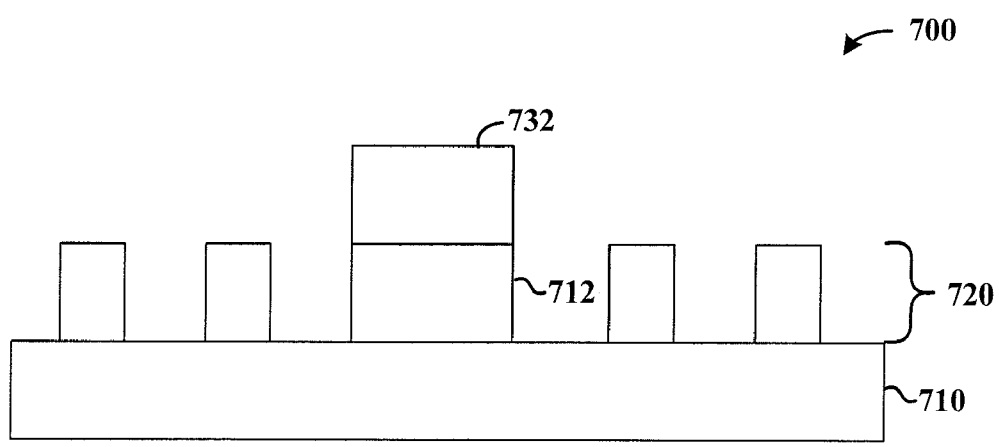

FIGS. 7A-7B show an approach to forming emitters in an optical microcavity arrangement 700, according to another example embodiment of the present invention. Beginning with FIG. 7A, an emitter layer 730 is formed on a substrate 710 and a patterned microcrystal layer 720 of the optical microcavity arrangement 700, shown in cross-section. The emitter layer 730 includes emitters located in another material, such as quantum dots suspended in a polymer.

At FIG. 7B, a portion of the emitter layer 730 has been removed using an approach such as photolithography, leaving a small portion 732 of the emitter layer over a selected optical microcavity 712. With this approach, one or more emitters in the emitter layer portion 732 are limited in optical coupling to the microcavity 712, which is useful for applications benefiting from precise emitter positioning such as in single-photon source applications.

Figure 8A:
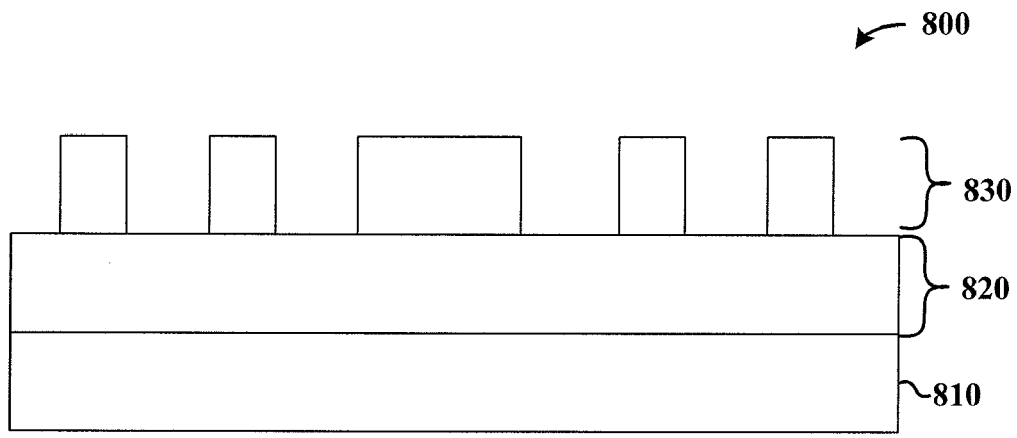
FIGS. 8A-8B show an approach to manufacturing an optical microcavity arrangement using a doped polymer mask, according to another example embodiment of the present invention.
Figure 8B:
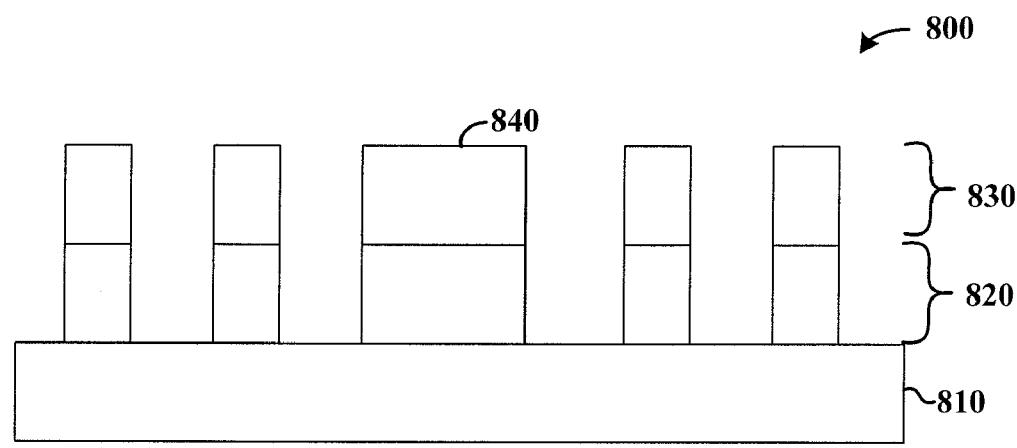

FIGS. 8A-8B show an approach to manufacturing an optical microcavity arrangement 800 using a doped polymer mask, according to another example embodiment of the present invention. Referring to FIG. 8A, a cross-sectional view of the arrangement 800 is shown with a microcrystal layer 820 formed on a substrate 810, and a doped polymer layer 830 patterned on the microcrystal layer.

Referring to FIG. 8B, the microcrystal layer 820 is etched to form microcavities, defined by etched holes, using the patterned polymer layer 830 as a mask. The resulting structure 800 in FIG. 8B has emitters located at the unetched regions of the microcrystal layer 820 including microcavities of the microcrystal layer, with an emitter/microcavity combination 840 shown by way of example.

Figure 9A:
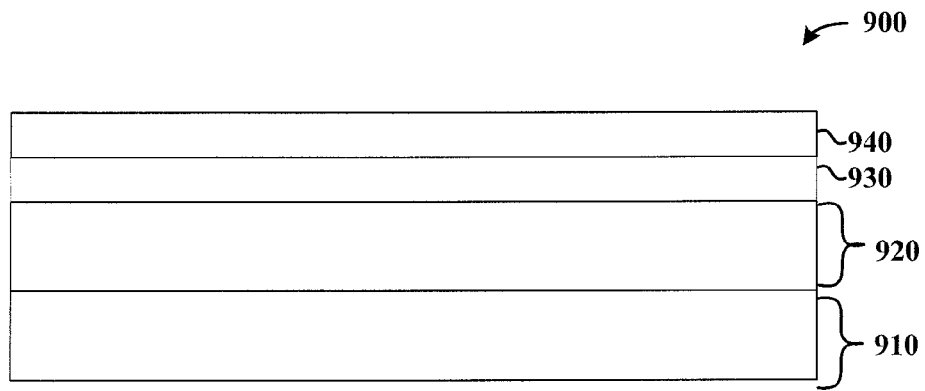
FIGS. 9A-9C show an approach to manufacturing an optical microcavity arrangement using a doped polymer layer, according to another example embodiment of the present invention.
Figure 9B:
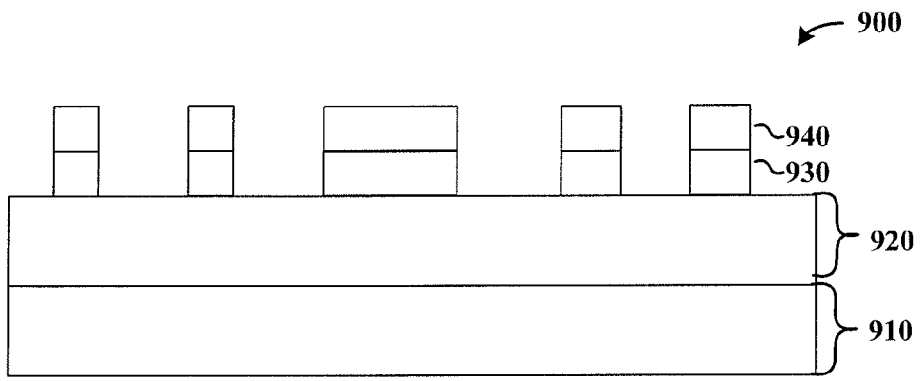
Figure 9C:
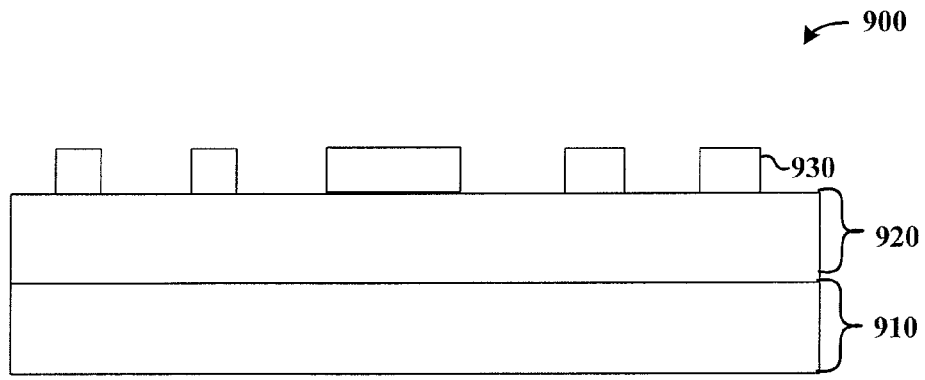

FIGS. 9A-9C show an approach to manufacturing an optical microcavity arrangement 900 using a doped polymer layer, according to another example embodiment of the present invention. Beginning with FIG. 9A, a cross-sectional view of the arrangement 900 shows a substrate 910 having three layers formed thereon, including a microcrystal layer 920, a doped polymer layer 930 and a mask layer 940 such as another polymer layer or a metal layer.

At FIG. 9B, the mask layer 940 has been patterned and used as a mask to etch the doped polymer layer 930. At FIG. 9C, the remaining portions of the mask layer 940 have been removed, with the resultant structure 900 including portions of the doped polymer layer 930 on the microcrystal layer 920.

In addition to the above, a variety of example embodiments are described in Ilya Fushman, Dirk Englund, and Jelena Vučković, *Coupling of PbS quantum dots to photonic crystal cavities at room temperature*, Applied Physics Letters, 87, 241102 (2005), upon which one or more example embodiments of this patent document are based. In many applications, the example embodiments described in this Fushman reference are implemented with one or more example embodiments and/or with one or more of the claims discussed below. Moreover, for general information regarding emitters, photonic crystals and/or other related matters, and for specific information regarding approaches that may be implemented in connection with one or more example embodiments described herein, reference may be made to the various references cited in this Fushman reference.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, applications other than single photon generation for quantum information processing, measurements on single photonic crystal cavities, lasers, photodetectors, and fluorescent labels in biological imaging applications may be amenable to implementation using similar approaches. In addition, one or more of the above example embodiments and implementations may be implemented with a variety of approaches, including various photonic crystal cavity construction approaches, as well as those described in connection with the references cited below. Furthermore, those applications directed to photonic crystal cavities are selectively implemented with micro- and nanocavities. Similarly, applications discussed in connection with quantum dots are selectively implemented with one or more of a variety of other emitters, such as those discussed above. These approaches are implemented in connection with various example embodiments of the present invention. Such modifications and changes do not depart from the true scope of the present invention, including that set forth in the following claims.

What is claimed is:

1. An optical microcavity arrangement comprising:
a microcrystal structure having cavities arranged therein to selectively pass light having a wavelength that is in a range of sub-micron wavelengths and to inhibit the passage of light having other wavelengths; and
a material located on the microcrystal structure and including emitters arranged therein to couple photon emissions to the cavities in said range of wavelengths.

2. The arrangement of claim 1, wherein the material is a colloid.

3. The arrangement of claim 1, wherein the material located on the microcrystal structure facilitates the selective passing of light in said range of wavelengths to define a photonic bandgap of the optical microcavity arrangement.

4. The arrangement of claim 1, wherein the emitters couple photon emissions to the cavities at a room temperature that is at least about twenty (20) degrees Celsius.

5. The arrangement of claim 1, wherein the emitters include at least one of quantum dots and nanocrystals.

6. The arrangement of claim 1, wherein the emitters include at least one of colloidal PbSe and PbS quantum dots.

7. The arrangement of claim 1, wherein the emitters emit photons in a non-visible wavelength.

8. The arrangement of claim 1, wherein the emitters emit light in both visible and non-visible wavelengths.

9. The arrangement of claim 1, further including a passive device, wherein at least one of the emitters is coupled to emit a photon in response to the passive device to facilitate the detection of a characteristic of the passive device.

10. The arrangement of claim 1, wherein the emitters emit a photon in response to a resonant characteristic of the microcrystal structure to facilitate the detection of the resonant characteristic.

11. The arrangement of claim 1, wherein the microcrystal structure enhances the spontaneous emission rate of the emitters.

12. The arrangement of claim 1, wherein the microcrystal structure suppresses the spontaneous emission rate of the emitters.

13. The arrangement of claim 1, wherein the microcrystal structure is a micro-disk.

14. An optical microcavity arrangement comprising: a microcrystal structure having cavities arranged therein to selectively pass light having a wavelength that is in a range of sub-micron wavelengths and to inhibit the passage of light having other wavelengths; and a material located and formed on the microcrystal structure as a layer and including emitters arranged therein to couple photon emissions to the cavities in said range of wavelengths, and the material is configured and arranged to facilitate increased heat dissipation from the microcrystal structure, relative to heat dissipation exhibited by the microcrystal structure.

15. An optical microcavity arrangement comprising:
a microcrystal structure having cavities arranged therein to selectively pass light having a wavelength that is in a range of sub-micron wavelengths and to inhibit the passage of light having other wavelengths; and
a material located on the microcrystal structure and including emitters arranged therein to couple photon emissions to the cavities in said range of wavelengths, wherein the emitters are coupled to selected target cavities in the microcrystal structure to amplify a response from the target cavities, relative to responses from non-selected cavities in the microcrystal structure.

16. A laser device comprising:
a microcrystal structure including a plurality of light-passing cavities to facilitate the passage of laser light;
a protective layer on the microcrystal structure to protect the microcrystal structure, the protective layer including a plurality of emitters optically coupled to the cavities to enhance the gain of laser light at the cavities.

17. The laser device of claim 16, wherein the protective layer symmetrizes the index of the cavities to facilitate light confinement and to suppress multimode operation of the cavities that arise in an asymmetric structure.

18. A biological detection arrangement comprising:
a microcrystal structure including a plurality of cavities to selectively pass light;
a plurality of emitters, each emitter connected to a biological material and optically coupled to one of the cavities; and
a detector to detect photon emissions from the emitters for use in detecting a characteristic of the biological material.

19. The arrangement of claim 18, wherein
the biological material includes a plurality of target molecules, each target molecule coupled to at least one of the cavities,
each of the plurality of emitters is selectively connected to a target molecule, and
the detector detects the presence of the target molecules at cavities by detecting the photon emissions from the emitters coupled to the target molecules.

20. A quantum information processor arrangement comprising:
an optical microcrystal structure having a plurality of optical microcavities to selectively pass light having a wavelength that is in a range of sub-micron wavelengths, and to inhibit the passage of light in other wavelengths;
an emitter layer on the optical microcavity and having emitters arranged therein to couple photon emissions to the optical cavities in said range of wavelengths;
a light detector to detect photons from the emitters and to output a signal in response to the detected photons; and
a microprocessor to use the signal and characteristics of the arrangement of the optical cavities to process data.

21. The arrangement of claim 20, wherein the emitter layer couples photon emissions to the optical cavities at a temperature that is at least about 20° C.

22. An optical microcavity arrangement comprising:
a microcrystal structure having photonic cavities arranged therein; and
a capping layer located on the microcrystal structure to mitigate contamination of the microcrystal structure, and
facilitate increased heat exchange between the microcrystal structure and a surrounding environment, relative to the heat exchange exhibited by the microcrystal structure without the capping layer.

23. The arrangement of claim 22, wherein
the microcavity structure has a quality factor associated therewith, and
the capping layer renders the quality factor of the microcavity substantially unaffected.

24. The arrangement of claim 22, wherein the capping layer facilitates the confinement of light in the microcrystal structure.

25. The arrangement of claim 22, wherein the capping layer symmetrizes the index of the microcrystal structure to facilitate the confinement of light and the suppression of multimode light.

26. An optical microcavity arrangement comprising:
microcrystal means, having cavities arranged therein, for selectively passing light having a wavelength that is in a range of sub-micron wavelengths and for inhibiting the passage of light having other wavelengths; and
a material located on the microcrystal structure and including emitters arranged therein to couple photon emissions to the cavities in said range of wavelengths.

27. A method comprising:
providing an optical microcavity arrangement with
a microcrystal structure having cavities arranged therein and having a material located on the microcrystal structure and including emitters arranged therein to couple photon emissions to the cavities in a range of sub-micron wavelengths; and
using the microcrystal structure to selectively pass light having a wavelength that is in the range of sub-micron wavelengths and to inhibit the passage of light having other wavelengths.

28. The method of claim 27, wherein the material located on the microcrystal structure facilitates the selective passing of light in said range of wavelengths to define a photonic bandgap of the optical microcavity arrangement.

29. The method of claim 27, wherein the emitters include at least one of nanocrystals and quantum dots, the quantum dots being in the form of at least one of PbSe and PbS quantum dots.

30. The method of claim 27, wherein the emitters emit light in both visible and non-visible wavelengths, and wherein the emitters couple photon emissions to the cavities at a room temperature that is at least about twenty (20) degrees Celsius.

31. The method of claim 27, further including a passive device, wherein at least one of the emitters is coupled to emit a photon in response to the passive device and is used to facilitate the detection of a characteristic of the passive device.

32. The method of claim 27, wherein the emitters emit a photon in response to a resonant characteristic of the microcrystal structure and are used to facilitate the detection of the resonant characteristic.

33. The method of claim 27, further including the step of using the microcrystal structure to change, by enhancing or suppressing, the spontaneous emission rate of the emitters.

34. A method comprising:
 providing an optical microcavity arrangement with
  a microcrystal structure having cavities arranged therein and having a material located on the microcrystal structure and including emitters arranged therein to couple photon emissions to the cavities in a range of sub-micron wavelengths; and
 using the microcrystal structure to selectively pass light having a wavelength that is in the range of sub-micron wavelengths and to inhibit the passage of light having other wavelengths, wherein the material is a layer formed on the microcrystal structure and facilitates increased heat dissipation from the microcrystal structure, relative to heat dissipation exhibited by the microcrystal structure.

35. A method comprising:
 providing an optical microcavity arrangement with
  a microcrystal structure having cavities arranged therein and having a material located on the microcrystal structure and including emitters arranged therein to couple photon emissions to the cavities in a range of sub-micron wavelengths; and
 using the microcrystal structure to selectively pass light having a wavelength that is in the range of sub-micron wavelengths and to inhibit the passage of light having other wavelengths, wherein the emitters are coupled to selected target cavities in the microcrystal structure and are used to amplify a response from the target cavities, relative to responses from non-selected cavities in the microcrystal structure.

* * * * *